United States Patent [19]

Kikuchi et al.

[11] Patent Number: 5,190,630
[45] Date of Patent: Mar. 2, 1993

[54] SPUTTERING TARGET

[75] Inventors: Makoto Kikuchi; Yoshiharu Fukasawa; Hideo Ishihara, all of Yokohama, Japan

[73] Assignee: Kabushiki Kaisha Toshiba, Kawasaki, Japan

[21] Appl. No.: 866,116

[22] Filed: Apr. 7, 1992

Related U.S. Application Data

[63] Continuation of Ser. No. 486,205, Feb. 28, 1990, abandoned.

[30] Foreign Application Priority Data

Mar. 1, 1989 [JP] Japan .................................. 1-49065

[51] Int. Cl.⁵ ...................... C23C 14/34; C23C 14/35
[52] U.S. Cl. ........................ 204/192.12; 204/298.12; 204/298.13; 204/192.17
[58] Field of Search ...................... 204/192.12, 192.15, 204/192.17, 192.21, 298.12, 298.13, 298.19

[56] References Cited

U.S. PATENT DOCUMENTS 4,505,798 3/1985 Ramachandran et al. ..... 204/298.19

FOREIGN PATENT DOCUMENTS 60-194069 10/1985 Japan .............................. 204/298.12

Primary Examiner—Aaron Weisstuch
Attorney, Agent, or Firm—Foley & Lardner

[57] ABSTRACT

The present invention consists of a sputtering target wherein target pieces made of at least two different kinds of materials are compositely arrayed in a manner as to be divided into the respective materials, characterized by having at least one irregular erosion region which is defined as a region enclosed with a circle having an erosion width as its diameter, located at a region farthest from the center of gravity of the sputtering target within a region to be eroded in a curvilinear shape, the irregular erosion region being formed at least partly of target pieces made of at least two kinds of materials having either shapes or surface areas thereof different from those of the target pieces lying outside the irregular erosion region and are compositely arrayed in a manner as to be divided into the respective materials.

16 Claims, 9 Drawing Sheets

SPUTTERING TARGET

This application is a continuation of application Ser. No. 486,205, filed Feb. 28, 1990, now abandoned.

BACKGROUND OF THE INVENTION

The present invention relates to a sputtering target, and more particularly to improvements in a composite sputtering target wherein a plurality of target pieces of different kinds of materials are arrayed.

Heretofore, sputtering technology has been extensively known as a technique for forming thin films on specified base materials. In the sputtering technology, various attempts have been made to form, not only a thin film which is constituted by a single component-substance, but also a thin film composed of multiple constituents such as an alloy or the like. In such sputtering technology, in the case where a target which is constituted with different components in a composition ratio deviating from stoichiometric amounts and is difficult to prepare, for example, a target of molybdenum and silicon, or in the case where an alloy target body of predetermined composition ratio is difficult to prepare because of a great difference in the melting points or vapor pressures of the alloy components, a composite sputtering target in which a plurality of kinds of constituents are respectively arranged in divided fashion is used (refer to, for example, Japanese Patent Laid-Open Publication No. 46631/1987).

As the composite target mentioned above, there has been known a target wherein a plurality of kinds of wedge-like target pieces are alternately combined into the shape of a disk, or a target body wherein elongated target pieces are alternately arrayed into the shape of a rectangular plate.

The deposition of a film employing the composite sputtering target as stated above has the advantage that the composition ratio of the film to be formed can be changed at will by changing the kinds and combination of the target pieces. In the case of, for example, a disk-shaped target body, the composition ratio is held identical in the radial direction of the target, so that the composition of the deposited film becomes uniform, and a deposited film conforming to the composition ratio of the target is obtained.

On the other hand, however, when the erosion of a target by sputtering does not proceed uniformly as in the case of the rectangular target body, a discrepancy inevitably arises between the composition ratio of the deposited film and that of the target, and sometimes a non-uniform region is present. This will be further explained below.

The above phenomenon will be elucidated in the case of employing a prior art composite target as shown in FIG. 1. The composite target 30 of the prior art includes Ta pieces 31 and Mo pieces 32 alternately arrayed in a predetermined composition ratio. When the target is used for sputtering, usually the area enclosed by the two-dot chain lines indicated in FIG. 2 forms an erosion region 33. In this case, in the middle part of the target in the longitudinal direction thereof, the composition ratio of the target corresponds exactly to that of the produced film. At both the end parts of the target in the longitudinal direction thereof, however, the lines of the sputtering depict curves or circular arcs, with the result that the erosion region 33 forms a shape affording non-uniform distribution of film constituents. This incurs the disadvantage that the fail to correspond exactly. In the case of the example shown in FIG. 2, the Ta content of the target is higher than in the desired composition at both the end parts thereof. In consequence, the produced alloy film exhibits non-uniform physical properties at both its end parts in the longitudinal direction thereof, thereby posing the problems that the efficiency of film formation and the available percentage of finished product are lower.

SUMMARY OF THE INVENTION

The present invention has been made in view of the problem involved in the background art as stated above, and has for its object to provide a composite sputtering target which prevents the composition of a deposited film from becoming non-uniform irrespective of the shape of the target or the shape of the erosion region of the target.

In order to accomplish the above object, the sputtering target of the present invention according to a first aspect consists of target pieces made of at least two different kinds of materials compositely arrayed, characterized by having at least one irregular erosion region which is defined as a region enclosed within a circle having an erosion width as its diameter, and at a region farthest from the center of gravity of said sputtering target within a region to be eroded in a curvilinear shape, at least a part of one of said irregular erosion regions is formed with a portion in which said target pieces made of at least two different kinds of materials have shapes or surface areas different from those of said target pieces lying outside the irregular erosion region.

Further, the sputtering target of the present invention in a second aspect consists of at least two different kinds of materials compositely arrayed, characterized by having at least one irregular erosion region which is defined as a region enclosed within a circle having an erosion width as its diameter, and at a region farthest from the center of gravity of said sputtering target within a region to be eroded in a curvilinear shape, an alloy target piece is arranged, at least, at a portion of said irregular erosion region, said alloy target piece being made of an alloy which contains the same constituent materials of said target pieces as its components.

BRIEF DESCRIPTION OF THE DRAWINGS

FIG. 4 and FIG. 5A are explanatory views each showing the locations of erosion and irregular erosion regions E in the case where a sputtering target is subjected to sputtering, while

DETAILED DESCRIPTION OF THE PREFERRED EMBODIMENTS

Figure 1:
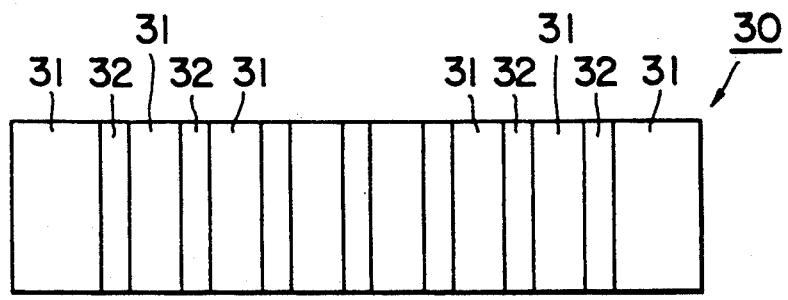
FIG. 1 is a plan view of a sputtering target of the prior art.
Figure 2:
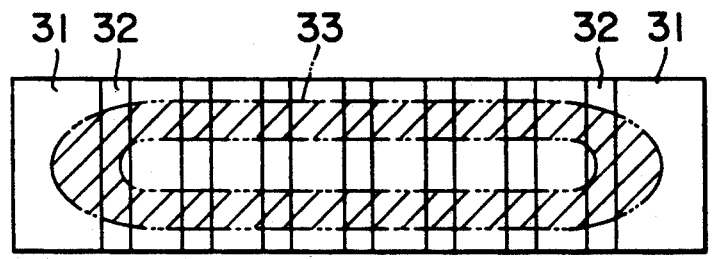
FIG. 2 is a plan view showing the erosion pattern in the case where the sputtering target in FIG. 1 is subjected to sputtering.

Now, the present invention will be described more specifically in conjunction with embodiments illustrated in the drawings.

Figure 3:
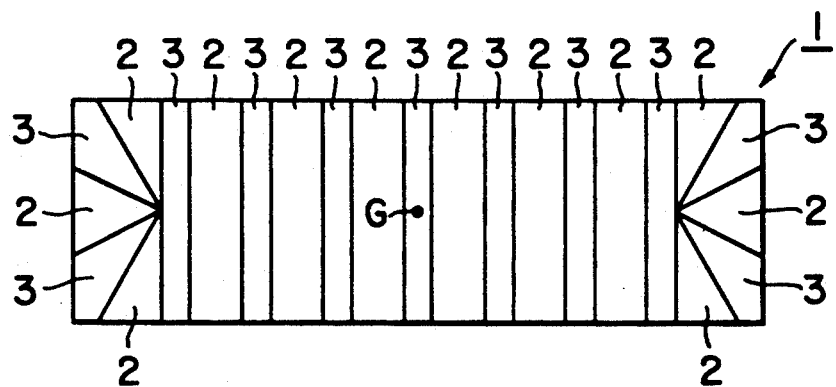
FIG. 3 and FIGS. 6 through 11 are plan views each showing an embodiment of a sputtering target according to the present invention.

FIG. 3 is a plan view of a sputtering target according to an embodiment of the present invention. In this example, the plan shape of the sputtering target 1 is rectangular as shown in the figure, and the rectangular structure is so constructed that Mo pieces 2 and Ta pieces 3 in the shapes of rectangles are alternately arranged except at both ends of the sputtering target in the longitudinal direction thereof. Thus, the shapes and/or the surface areas of respective target pieces of Mo and Ta arrayed at both ends can be appropriately determined so that the composition of each end portion of a deposited film may be the same as the composition of the central part thereof.

By arraying the target pieces in such a combination in which the shapes and/or the surface areas of the respective target pieces are changed, the composition of the end portions of the formed film is adjusted into the optimum state, and the composition ratio of the produced film can be caused to correspond exactly to that of the target. It is therefore possible to eliminate the problem of non-uniform composition of the end portions of the film which hitherto inevitably appeared in accordance with the pattern of erosion, and to obtain a deposited film of uniform composition and film characteristics (for example, specific resistance).

This aspect of the present invention will be described in more detail.

Figure 4:
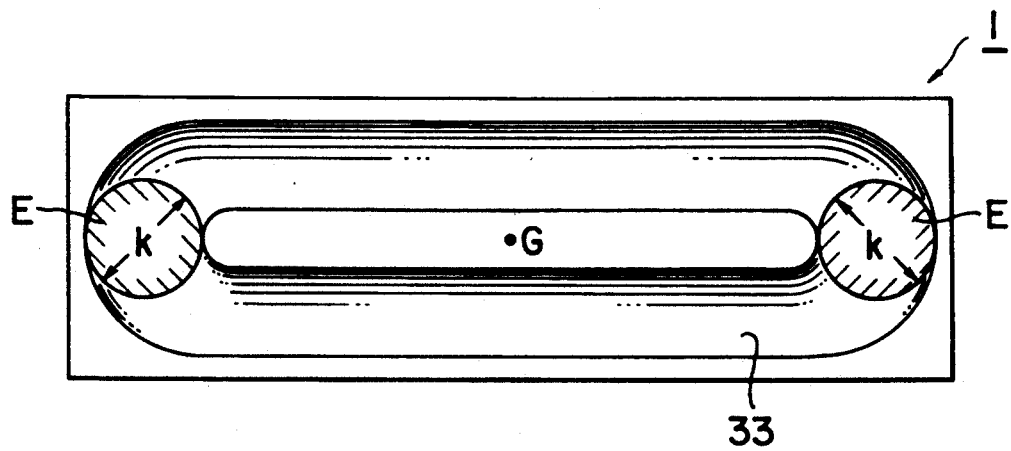

A plan view shown in FIG. 4 illustrates the situation in which an erosion region 33 is formed in a sputtering target 1 having a rectangular plan shape. As to such an erosion region 33, the present invention is characterized by comprising irregular erosion regions E, each of which is defined by a region enclosed with a circle having an erosion width k as its diameter, at an erosion region farthest from the center of gravity G of the sputtering target within a region to be eroded in a curvilinear shape, at least one of the irregular erosion regions E being formed at least partly with a portion in which the target pieces made of at least two kinds of materials have either the shapes or the surface areas thereof made different from those of the target pieces lying outside the irregular erosion region In the preferred aspect of the present invention, it is especially favorable that the number of target pieces dividedly arrayed be in the range of 2-21 within each of the irregular erosion regions. By dividing the target pieces within the irregular erosion region into any number falling within the specified range, the characteristics of a deposited film can be made uniform over the whole extent thereof, and the quality of the film itself is enhanced.

According to the inventors' researches, a sputtering target which poses no problem in practical use and which is advantageous from the view point of cost can be prepared by dividing and arraying target pieces so that the maximum resistance error rate in a deposited film to be obtained by subjecting the sputtering target to a sputtering operation is 15% or less, as expressed by the following formula:

$$\text{Max. resistance error rate (\%)} = \frac{|\overline{x} - X|}{\overline{x}} \times 100$$

wherein, $\overline{x}$ signifies the average value of the resistances of the respective points of the deposited film formed into a shape and an area corresponding to those of the sputtering target, the points dividing into 20 equal parts the center line of the deposited film which extends in the longitudinal direction thereof and which passes through the center of gravity G thereof, while X signifies a resistance value which has the greatest difference from the average value $\overline{x}$.

As will also be discussed in an example to be described later, in the case where the number of the target pieces in one irregular erosion region is less than 2, the maximum resistance error rate increases abruptly. On the other hand, when the number of the target pieces exceeds 21, the number of the boundaries between the target pieces increases, and impurities and minute particles developed by so-called reverse sputtering intrude into the boundary parts. The impurities and particles scatter as foreign matter in the sputtering operation, resulting unfavorably in an increased proportion of the foreign matter mixed into the formed film. Moreover, an increase in the divisional number is disadvantageous from the view point of the cost of manufacture of the target.

In the present invention, in the case where the target is a combination of the target pieces made of two different kinds of materials, the number of the target pieces of either of the materials may preferably be (N/2) or (N/2) ± 1 where N denotes the total number of the target pieces to be arrayed in each irregular erosion region.

Incidentally, in the present invention, even in the case where only one target piece is disposed in the irregular erosion region, the maximum resistance error rate can be suppressed to 15% or less by setting the central angle or vertical angle of the target piece at 45 -160 degrees, more preferably 60-150 degrees. This will be explained later (Example 1).

Figure 5A:
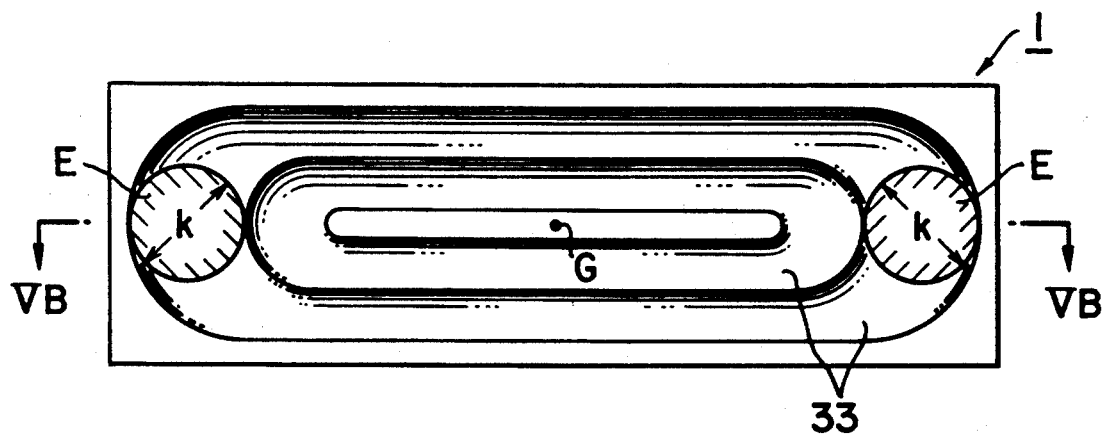
Figure 5B:
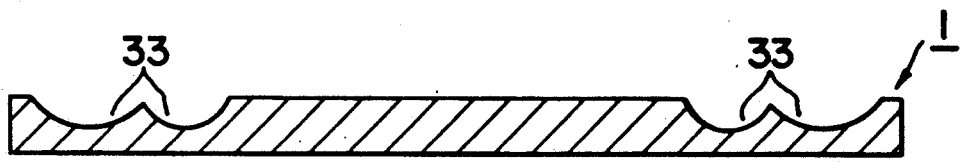
FIG. 5B is a sectional view taken along VB—VB in FIG. 5A.

FIG. 5A is a plan view showing the situation of erosion in the case where a sputtering operation is carried out using a sputtering apparatus which has plural magnetrons, while FIG. 5B is a sectional view showing the profile of a section which is taken along the longitudinal center line of a sputtering target in FIG. 5A passing through the center of gravity G thereof. According to the present invention, the target 1 has a sufficient number of target pieces in the irregular erosion region satisfies and the condition of the maximum resistance error rate, whereby favorable results can be obtained.

Now, practical aspects of the target of the present invention will be further described.

Figure 6:
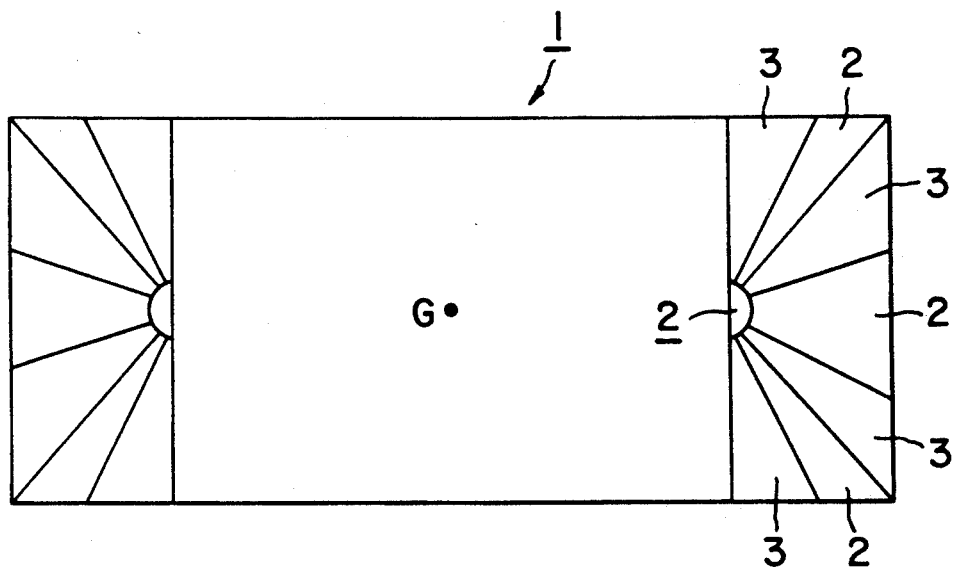
Figure 7:
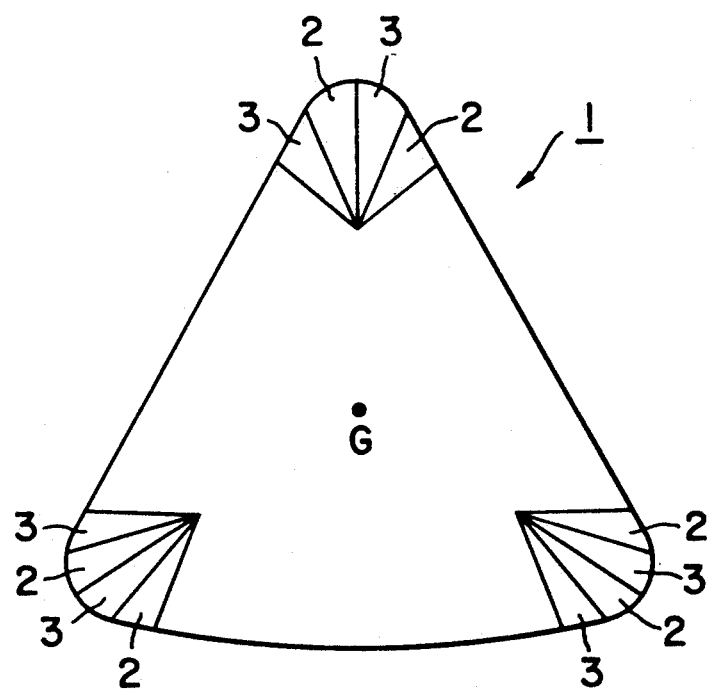
Figure 14:
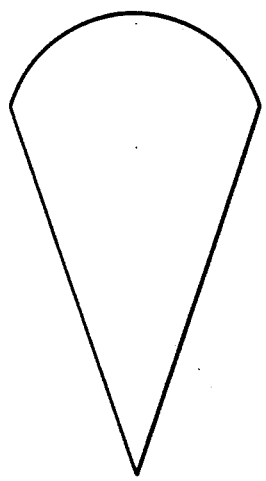
FIG. 14 and FIG. 15 are plan views each showing the shape of a target piece.
Figure 15:
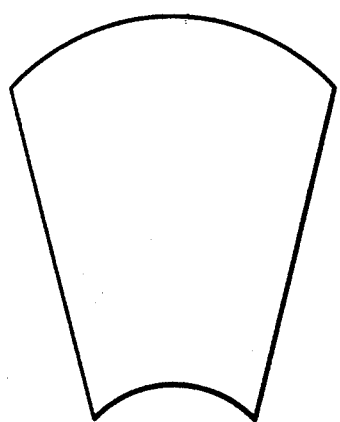

The embodiment shown in FIG. 3 corresponds to the case where the wedge-shaped target pieces are arrayed in sectoral fashion at only at the end portions of the rectangular structure in the longitudinal direction thereof. In the present invention, however, other various embodiments can be contrived and utilized. By way of example, the embodiment shown in FIG. 6 can include in combination, triangles or shapes configured of straight lines and curves as shown in FIGS. 14 and 15. In the embodiment shown in FIG. 7, target 1 may well be in a shape other than a square, for example, a triangular shape, a shape resembling a triangle and having curves at the corners thereof, or a shape resembling a sector and target has a plan shape in which the irregular erosion region is formed, the present invention is similarly applicable. In the embodiment of FIG. 7, Mo target pieces 2 and Ta target pieces 3 are dividedly and alternately arrayed in each irregular erosion region as illustrated in the figure.

Figure 8:
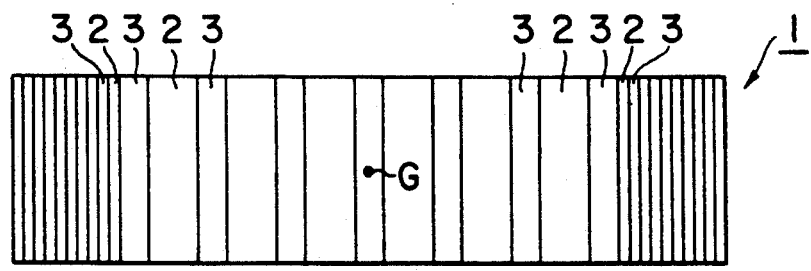

The embodiment shown in FIG. 8 is such that, at both the outermost end portions of a target in the longitudinal direction thereof, Mo and Ta target pieces which differ in the ratio of surface areas from Mo and Ta are alternately arrayed in parallel. The composition of a film to be formed can be adjusted even when the target pieces arrayed at the middle part and both the end parts the target have only the surface area ratios thereof changed appropriately in this manner.

Figure 9:
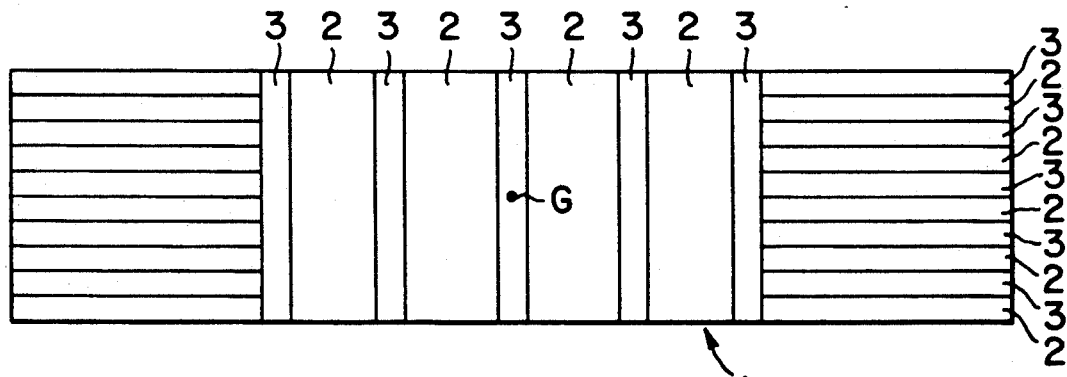
Figure 10:
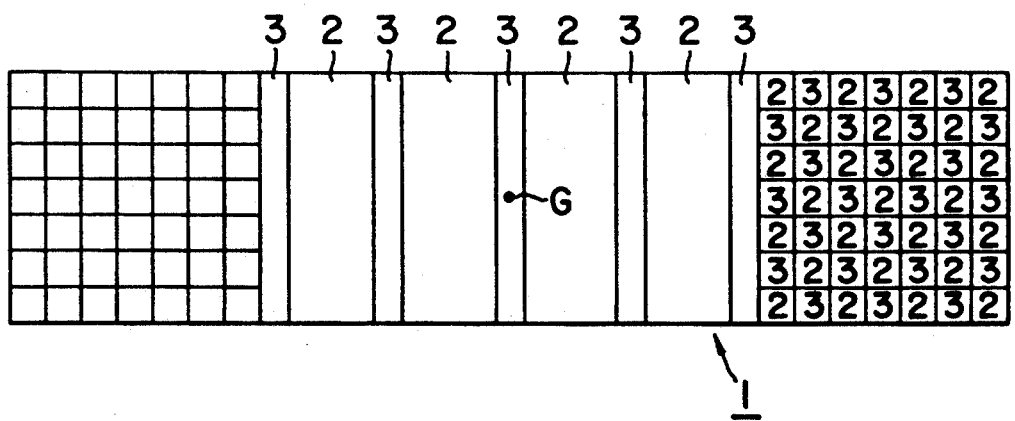
Figure 11:
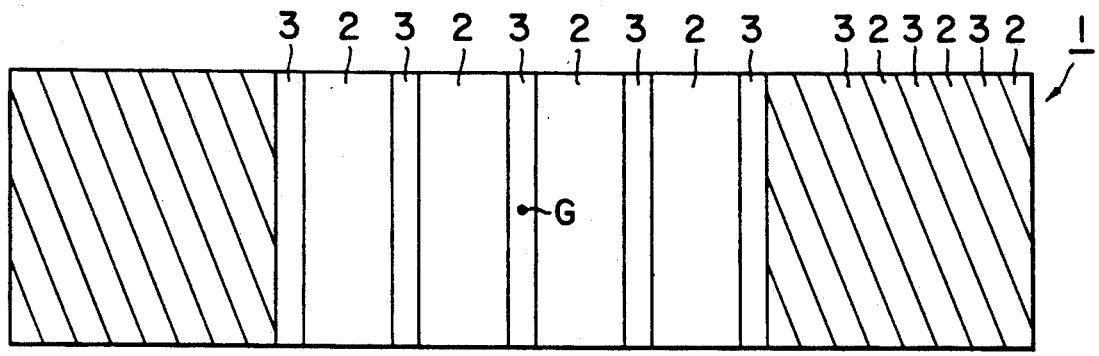

Further, FIGS. 9 thru 11 show modified embodiments of the present invention, and such aspects are also covered within the scope of the present invention.

Next, the composition of a deposited film will be explained by taking as an example an Mo-Ta-based composite sputtering target for forming a Mo-Ta alloy film for electric wiring.

In recent years, there has been developed an active matrix type liquid-crystal display device which is constructed by employing thin-film transistors (TFT's) made of an amorphous silicon film as switching elements. This is because a panel display (a flat TV receiver) of large area, high precision, high picture quality and low cost might be realized in such a way that a TFT array is formed using the amorphous silicon film which can be deposited at low temperatures on an amorphous glass substrate. Meanwhile, signal lines to the TFT's, namely gate wiring lines and data wiring lines, need to be made fine and long for the purposes of reducing the size of the display pixels of such an active matrix type liquid-crystal display device to the utmost and enlarging the area of the device. By way of example, in the case of adopting a stagger type TFT structure wherein the TFT's are constructed by laying the gate-electrode wiring on the glass substrate side and stacking an insulator film and the amorphous silicon film on the surface thereof, the gate-electrode wiring is required to be a material which is thin, which exhibits a sufficiently low resistance and which endures subsequent treatments with chemicals.

As the gate wiring materials meeting such requirements, films of various metals such as tantalum (Ta) and titanium (Ti) have heretofore been used. For the purposes of attaining a still larger area and a still higher precision, however, the gate wiring needs to be made of a material which exhibits a lower resistance, which has a superior workability and which is more durable when subjected to various chemical treatments in a manufacturing process.

The alloy film of Ta and Mo as stated before is suitable as an alloy film meeting the above requirements, and the present invention demonstrates excellent effects as a sputtering target therefor.

Specifically, regarding the alloy film well suited for the use as described above, the deposited film formed by sputtering has a composition consisting of 5–70% of Mo and 30–95% of Ta in terms of atomic percent, more preferably 15–50% of Mo and 50–85% of Ta.

As the alloy composition, a composition whose Ta content is less than 30 atomic-% or whose Mo content is in excess of 70 atomic-% is unfavorable for the reasons that the electric resistance of the alloy film increases and the formability of the oxide film and washability with chemicals degrade. On the other hand, a composition whose Ta content is in excess of 95 atomic-% or whose Mo content is less than 5 atomic-% is not suited for the above use for the reason that the electric resistance of the alloy film increases, even though the workability of the alloy film itself and the formability of the oxide film are enhanced.

Since, according to the target of the present invention, an alloy film conforming exactly to a desired composition can be obtained, an alloy film having a maximum resistance error rate not higher than 15% can be manufactured by using the composite target in which the areal ratio of the target pieces is adjusted to the composition within the specified range.

The inventors systematically repeated experiments on various metal and alloy films as the electric wiring materials of semiconductor devices employing amorphous silicon films, polycrystalline silicon films, single-crystal silicon substrates, etc. As a result, it has been found out that an alloy film made of Ta and Mo within the more restricted composition range exhibits an electric resistance which is much lower than that of a film containing Ta or Mo alone. Further, the alloy film whose composition is thus restricted is also excellent in such properties as the workability, ohmic contact with silicon and the formability of the oxide film, each of which is required of the large-area thin film for electric wiring.

As a sputtering target for producing the alloy film described above, the target itself may also be made of the alloy, apart from the foregoing composite targets made of two different kinds of materials.

Now, the second aspect of the present invention will be described.

The sputtering target of the present invention according to the second aspect consists of a sputtering target wherein target pieces made of at least two different kinds of materials characterized by having at least one irregular erosion region which is defined as a region enclosed within a circle having an erosion width as its diameter, and at a region farthest from the center of gravity of said sputtering target within a region to be eroded in a curvilinear shape, an alloy target piece is arranged, at least at a portion of said irregular erosion region, said alloy target piece being made of an alloy which contains the same constituents of said target pieces as its components.

Figure 12:
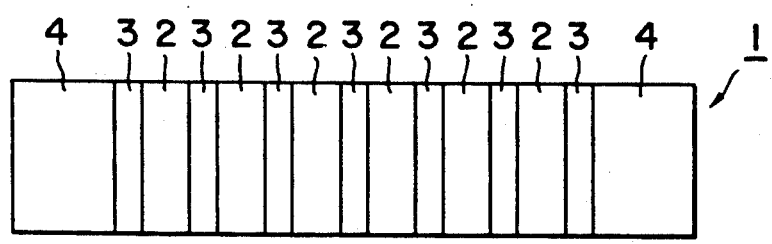
FIG. 12 and FIG. 13 are plan views each showing an embodiment of the sputtering target of the present invention in which alloy target pieces are arranged in irregular erosion regions.

The embodiment shown in FIG. 12 is a sputtering target having a rectangular plan shape. The rectangular structure is so constructed that Mo target pieces 2 and Ta target pieces 3 are alternately arranged at the middle part of the target in the longitudinal direction thereof, while alloy target pieces 4 made of Mo-Ta alloy of predetermined composition are arranged at both end portions. The composition of the alloy target pieces 4 can be appropriately adjusted so that the composition at the end portions becomes identical to that of the composition of the middle portion of the film to-be-formed. Thus, the composition of the alloy target pieces can be properly selected in accordance with the desired film composition and the shape of the target.

In this manner, according to the present invention, the alloy target piece 4 as described above is arranged at least at a portion of the irregular erosion region, whereby the film composition in the irregular erosion region can be equalized to the film composition in the other region. It is thus possible to eliminate the problem of the nonuniform film composition and to manufacture a deposited film of high quality having composition and film characteristics (for example, specific resistance) which are uniform.

Figure 13:
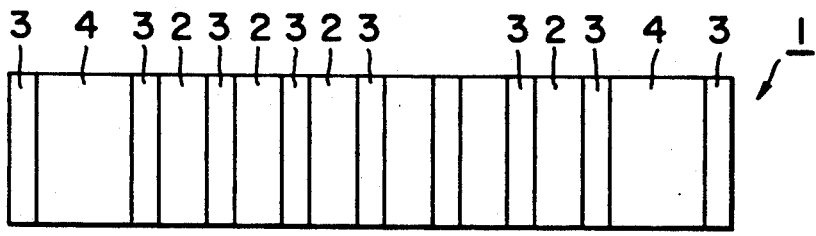

The embodiment shown in FIG. 12 corresponds to the case where the alloy target pieces are arranged at both end portions of the rectangular structure in the longitudinal direction thereof. However, the present invention is not restricted only to such an aspect, but, as shown in FIG. 13 by way of example, a Ta piece 3 can be arranged at each end portion in the longitudinal direction, while the alloy target piece 4 is arranged at a portion adjacent thereto. In other words, it suffices in the present invention that the alloy target piece 4 as described above is arranged at least at a portion of the irregular erosion region.

Incidentally, such alloy target pieces are similarly applicable to the foregoing composite targets as shown in FIG. 3 and FIGS. 6 thru 11.

The alloy target pieces as specified above can be manufactured by melting the constituent metals thereof by a fusion process such as electron-beam fusion or consumable-electrode arc fusion.

There will now be described examples in which composite sputtering targets were actually fabricated and then used for forming alloy films.

EXAMPLE 1

A Ta-Mo-based composite target as shown in FIG. 3, in which wedge-shaped target pieces were arrayed in each irregular erosion region, was fabricated. The conditions of the fabrication were as stated below.

First, the rectangular Ta target pieces 2 and rectangular Mo target pieces 3 formed by cutting and grinding were alternately arrayed, under the condition that the number of the Mo target pieces was larger by one. In this case, at both the end portions of the target in the longitudinal direction thereof, the wedge-shaped target pieces of Mo and Ta were alternately arrayed so as to become symmetric with respect to the two center lines of the target passing through the center of gravity G thereof. The target thus fabricated had a width of 127 mm and a length of 508 mm.

Using the target of unequal divisional numbers obtained as described above, Mo-Ta alloy thin film was formed under power conditions of 6 A and 2 kW by a D.C. magnetron sputtering apparatus in an argon atmosphere.

For each of the samples of the alloy film produced, the maximum resistance error rate was measured. It is given by the following formula:

$$\text{Maximum resistance error rate (\%)} = \frac{|\bar{x} - X|}{\bar{x}} \times 100$$

wherein, $\bar{x}$ signifies the average value of the resistances of the respective points of the deposited film formed into a shape and an area corresponding to those of the sputtering target, the points dividing into 20 equal parts the center line of the deposited film which extends in the longitudinal direction thereof and which passes through the center of gravity G thereof, while X signifies a resistance value which has the greatest difference from the average value $\bar{x}$.

Figure 16:
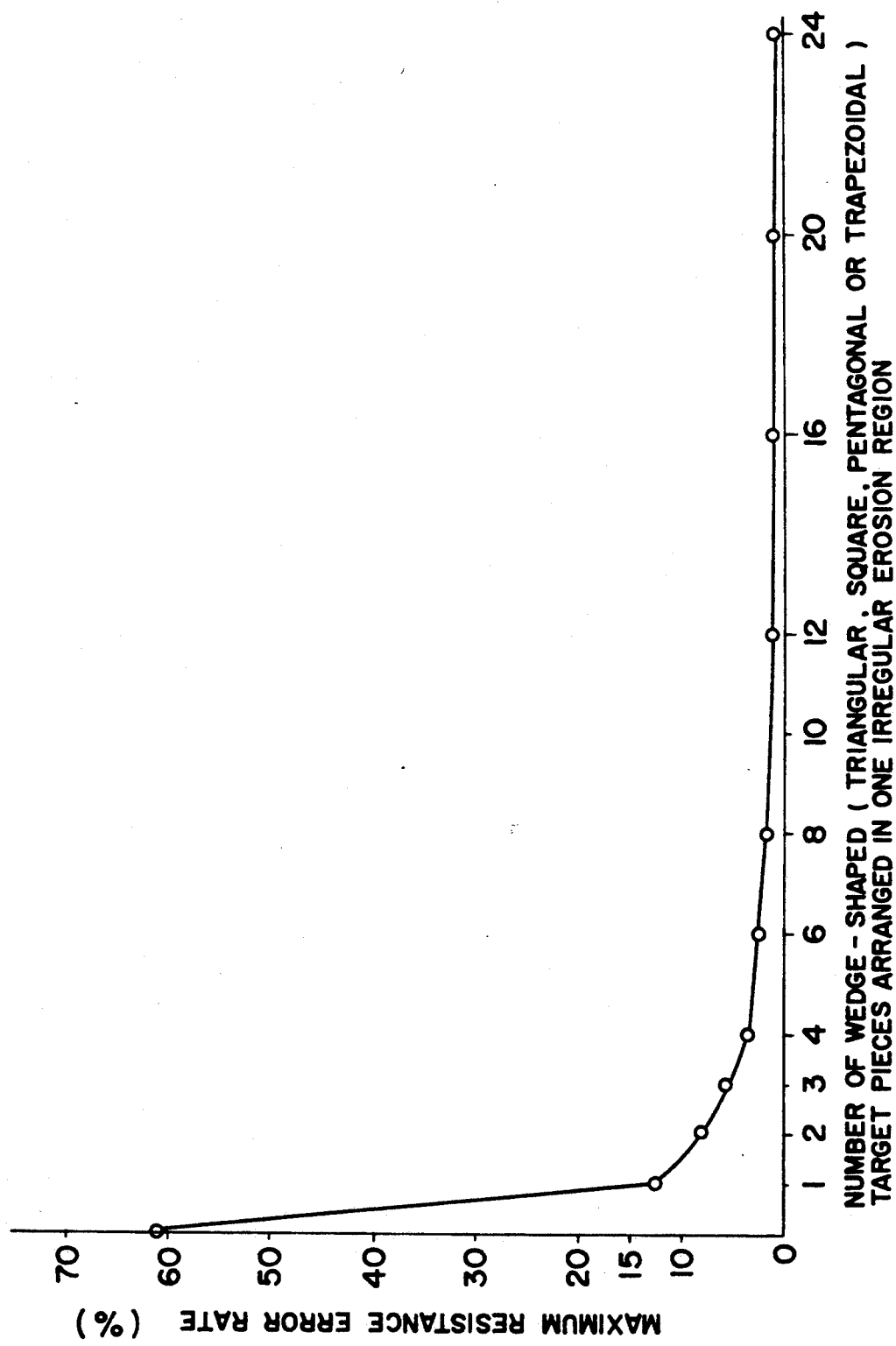
FIG. 16 and FIG. 17 are graphs each showing the relationship of the maximum resistance error rate with the number of target pieces in an irregular erosion region.

The measured results are shown in FIG. 16. In the graph, the abscissa represents the number of the target pieces existing within a circle (irregular erosion region) which has a radius of 28 mm and whose center lies at a point 30 mm distant from the corresponding end of the target in the longitudinal direction thereof.

As seen from FIG. 16, in the case where no wedge-shaped, triangular, square or pentagonal target piece is arranged in the irregular erosion region, the maximum resistance error rate becomes 62%, and a wide dispersion in resistances arises. In contrast, in the case where at least one target piece having such a shape is arranged, the maximum resistance error rate becomes below 15% or below 10%, and an alloy film which is of satisfactorily stable quality as a wiring material, particularly for the gate electrode of a thin-film transistor, is produced.

Figure 18:
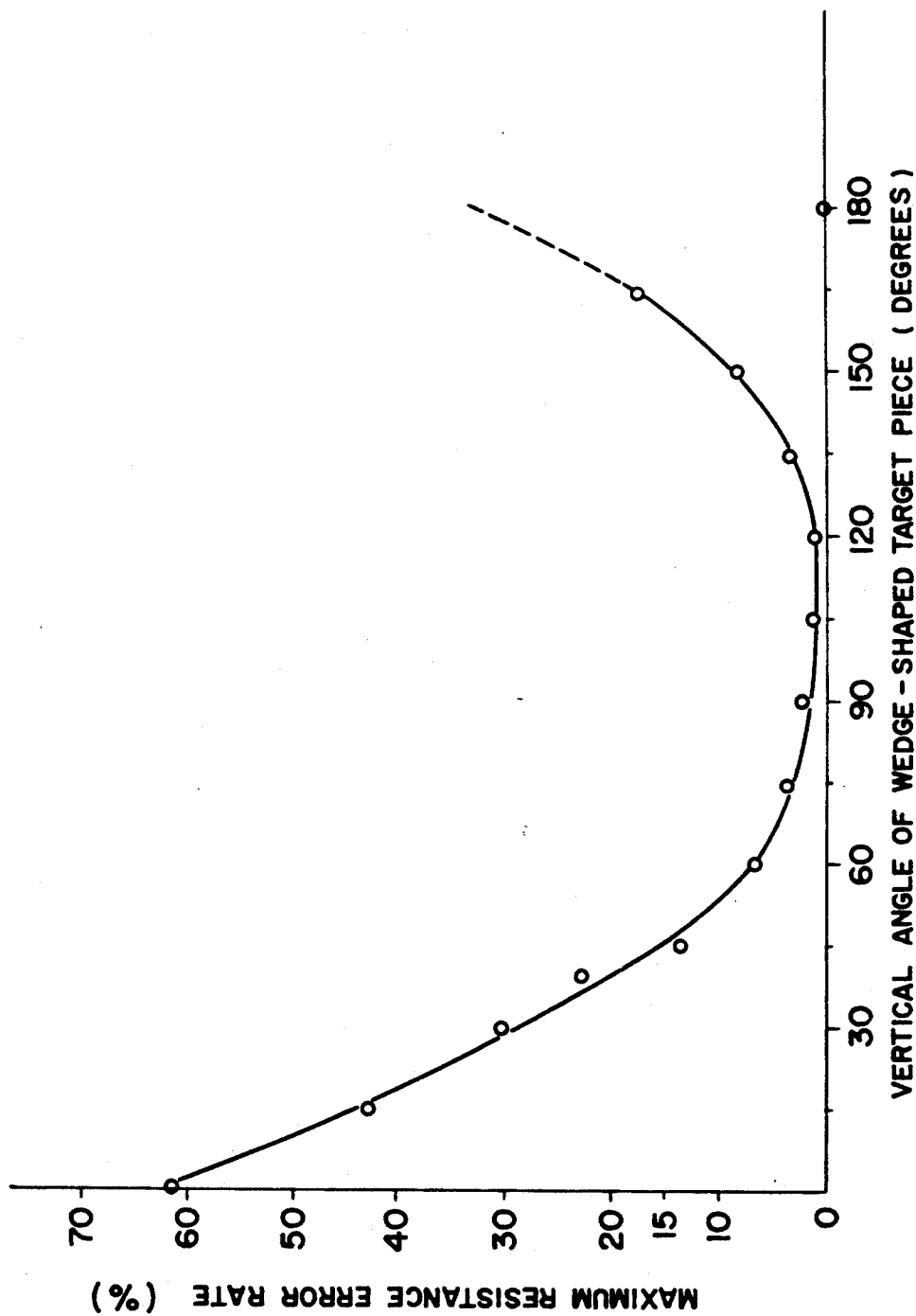
FIG. 18 is a graph showing the relationship of the maximum resistance error rate with the degrees of the vertical angle of each of the target pieces (wedge-shaped pieces).

In this case, the reason why the favorable results were obtained even with the single target piece is that the vertical angle or central angle of the target piece arranged in the irregular erosion region was set within a range of 45-160 degrees. FIG. 18 is a graph showing the relationship between the maximum resistance error rate and the extent of the vertical angle or central angle of the target piece (for example, a wedge-shaped, trapezoidal or pentagonal piece) arranged in the irregular erosion region. As seen from the graph, even when the single target piece is arranged in the irregular erosion region, the maximum resistance error rate can be made 15% or less by setting the vertical angle or central angle of the target piece within the range of 45-160 degrees.

EXAMPLE 2

Next, Ta-Mo-based composite targets having target arrays as shown in FIGS. 8, 9 and 10 were fabricated. The conditions of the fabrication were as stated below.

First, as to each of the targets, the rectangular Ta target pieces 2 and rectangular Mo target pieces 3 formed by cutting and grinding were alternately arrayed under the condition that the number of the Mo target pieces was larger by one. In this case, at both end portions of the target in the longitudinal direction thereof, the surface areas of the square target pieces were made different from those at the middle part of the target and were alternately arrayed so as to become symmetric with respect to the two center lines of the target passing through the center of gravity G thereof. The target thus fabricated had a width of 127 mm and a length of 508 mm.

Using the targets of unequal divisional numbers obtained as described above, sputtering operations were carried out to form Mo-Ta alloy films.

More specifically, each of the targets of unequal divisional numbers obtained as described above was used to form an Mo-Ta alloy thin film under power conditions of 6 A and 2 kW by means of a D.C. magnetron sputtering apparatus in an argon atmosphere.

As to each of the samples of the alloy films produced, the maximum resistance error rate was measured. The measurement of the maximum resistance error rate was done by the same method as in Example 1.

Figure 17:
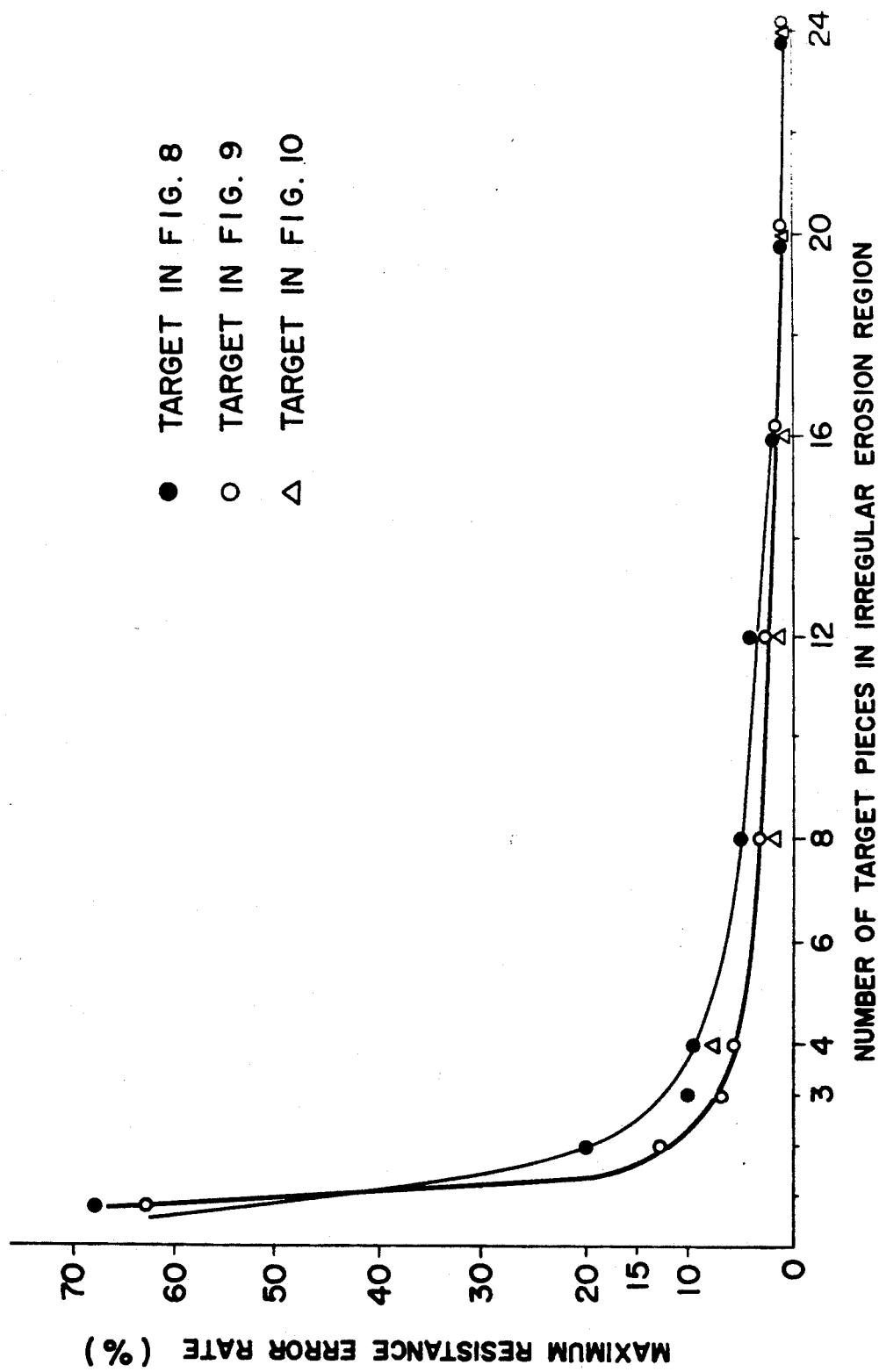

The measured results are shown in FIG. 17. In the graph, the abscissa represents the number of the target pieces existing within a circle (irregular erosion region) which has a radius of 28 mm and whose center lies at a point 90 mm distant from the corresponding end of the targets in the longitudinal direction thereof.

As seen from FIG. 17, when the number of the target pieces in the irregular erosion region is less than 2, the maximum resistance error rate increases extremely, and a wide dispersion in resistances is observed. In contrast, when the number of the target pieces is 2-3 or more, the maximum resistance error rate becomes 15-10% or less, and an alloy film which is of satisfactorily stable quality as a wiring material, particularly for the gate electrode of a thin-film transistor, is produced.

A sputtering target according to the present invention is extensively applicable as a target for forming a metal thin film which is used in semiconductor devices etc. In particular, since the sputtering target according to the present invention makes it possible to produce a metal thin film of large area and homogeneous film characteristics, it is well suited to the formation of a wiring thin film which is useful for a panel display (flat television receiver) of large area, high precision, high picture quality and low cost.

We claim:

1. A sputtering target comprising target pieces of different materials compositely arrayed therein,
    said sputtering target having at least one irregular erosion region which is defined as a region enclosed within a circle having an erosion width as its diameter, at a part farthest from the center of gravity of said sputtering target within a region to be eroded in a curvilinear shape,
    said target pieces each having a wedge shape and 4 to 21 of said target pieces being arrayed within each said irregular erosion region,
    whereby said sputtering target has a maximum resistance error rate of at most 10% is expressed by the following formula in a deposited film obtained by subjecting said sputtering target to sputtering:

$$\text{Maximum resistance error rate (\%)} = \frac{(\bar{x} - X)}{\bar{x}} \times 100$$

wherein, $\bar{x}$ signifies an average value of resistances of respective points of said deposited film formed into a shape and an area corresponding to those of said sputtering target, said points dividing into 20 equal parts on the center line of said deposited film which extends in the longitudinal direction thereof, and X signifies a resistance value which has the greatest difference from the average value $\bar{x}$.

2. A sputtering target as defined in claim 1, wherein at least one target piece in a shape which has an extend of 45-160 degrees in terms of either of a central angle and a vertical angle is arranged within at least one of said irregular erosion regions.

3. A sputtering target as defined in claim 1, comprising a plurality of such irregular erosion regions.

4. A sputtering target as defined in claim 1, which is adapted to be eroded by the use of a sputtering apparatus having a single magnetron.

5. A sputtering target as defined in claim 1, which is adapted to be eroded by the use of a sputtering apparatus having a plurality of magnetrons.

6. A sputtering target as defined in claim 1, wherein each individual target piece is formed of a single kind of material, and the composite of said target pieces is a combination of two different kinds of materials, and wherein the number of said target pieces of either of said materials is in the range $(N/2)-1$ to $(N/2)+1$, where N denotes the total number of said target pieces arrayed in said at least one irregular erosion region.

7. A sputtering target as defined in claim 1, wherein rod each individual target piece is formed of a single kind of material, and the composite of said target pieces is a combination of three different kinds of materials.

8. A sputtering target as defined in claim 1, wherein said target pieces are arrayed in a manner as to alternate as to the respective different materials and to be symmetric with respect to the center line of said target.

9. A sputtering target as defined in claim 1, which is a composite target made of molybdenum and tantalum.

10. A sputtering target as defined in claim 9, wherein the areal ratio of said target pieces is adjusted so that the composition of a deposited film to be formed by sputtering may consist of 5-70 atomic-% of molybdenum, 30-95 atomic-% of tantalum, and inevitable impurities.

11. A sputtering target as defined in claim 1, wherein a target piece made of an alloy is arrayed at least at a portion of each said irregular erosion region.

12. A sputtering target comprising target pieces of different materials compositely arrayed therein,
    said sputtering target having at least one irregular erosion region which is defined as a region enclosed within a circle having an erosion width as its diameter, at a part farthest from the center of gravity of said sputtering target within a region to be eroded in a curvilinear shape,
    an alloy target piece being arranged at, at least, a part of said irregular erosion region, said alloy target piece being made of an alloy which contains as its components the same constituents as said target pieces,
    whereby said sputtering target has a maximum resistance error rate of at most 10% as expressed by the following formula in a deposited film obtained by subjecting said sputtering target to sputtering:

$$\text{Maximum resistance error rate (\%)} = \frac{(\bar{x} - X)}{\bar{x}} \times 100$$

wherein, $\bar{x}$ signifies an average value of resistances of respective points of said deposited film formed into a shape and an area corresponding to those of said sputtering target, said points dividing into 20 equal parts on the center line of said deposited film which extends in the longitudinal direction thereof, and X signifies a resistance value which has the greatest difference from the average value $\bar{x}$.

13. A sputtering target as defined in claim 12, wherein said alloy target piece is made of molybdenum and tantalum.

14. A sputtering target as defined in claim 12, wherein the compositions of said target pieces are adjusted so that a composition of a deposited film to be formed by sputtering may consist of 5-70 atomic-% of molybdenum, 30-95 atomic-% of tantalum, and inevitable impurities.

15. A method of forming a metal thin film on a substrate by use of a sputtering target, comprising the steps of:
    providing a sputtering target comprising target pieces of different materials compositely arrayed therein, said sputtering target having at least one irregular erosion region which is defined as a region enclosed within a circle having an erosion width as its diameter, at a part farthest from the center of gravity of said sputtering target within a region to be eroded in a curvilinear shape, said target pieces each having a wedge shape or a quadrangular shape and 4 to 21 of said target pieces being arrayed within each said irregular erosion region; and subjecting said sputtering target to sputtering, thereby to form a deposited film on said substrate, said deposited film having a maximum resistance error rate of at least 10% as expressed by the following formula in a deposited film obtained by subjecting said sputtering target to sputtering:

$$\text{Maximum resistance error rate (\%)} = \frac{(\bar{x} - X)}{\bar{x}} \times 100$$

wherein, $\bar{x}$ signifies an average value of resistances of respective points of said deposited film formed into a shape and an area corresponding to those of said sputtering target, said points dividing into 20 equal parts on the center line of said deposited film which extends in the longitudinal direction thereof, and X signifies a resistance value which has the greatest difference from the average value $\bar{x}$.

16. A sputtering target comprising target pieces of different materials compositely arrayed therein, said sputtering target having at least one irregular erosion region which is defined as a region enclosed within a circle having an erosion width as its diameter, at a part farthest from the center of gravity of said sputtering target within a region to be eroded in a curvilinear shape, said target pieces each having a gradrangular shape and 4 to 21 of said target pieces being arrayed within each said irregular erosion region, whereby said sputtering target has a maximum resistance error rate of at most 10% as expressed by the following formula in a deposited film obtained by subjecting said sputtering target to sputtering:

$$\text{Maximum resistance error rate (\%)} = \frac{(\bar{x} - X)}{\bar{x}} \times 100$$

wherein, $\bar{x}$ signifies an average value of resistances of respective points of said deposited film formed into a shape and an area corresponding to those of said sputtering target, said points dividing into 20 equal parts on the center line of said deposited film which extends in the longitudinal direction thereof, and X signifies a resistance value which has the greatest difference from the average value $\bar{x}$.

* * * * *